(12) United States Patent
Duggal et al.

(10) Patent No.: US 6,777,871 B2
(45) Date of Patent: Aug. 17, 2004

(54) ORGANIC ELECTROLUMINESCENT DEVICES WITH ENHANCED LIGHT EXTRACTION

(75) Inventors: Anil Raj Duggal, Niskayuna, NY (US); Lionel Monty Levinson, Schenectady, NY (US); Joseph John Shiang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 412 days.

(21) Appl. No.: 09/741,961

(22) Filed: Dec. 22, 2000

(65) Prior Publication Data

US 2001/0033135 A1 Oct. 25, 2001

Related U.S. Application Data

(60) Provisional application No. 60/194,068, filed on Mar. 31, 2000.

(51) Int. Cl.$^7$ ............................. H01J 1/62; H01J 63/04
(52) U.S. Cl. ....................................... 313/506; 313/504
(58) Field of Search ................................ 313/506, 504, 313/503; 425/690; 445/24, 25

(56) References Cited

U.S. PATENT DOCUMENTS

| | | | |
|---|---|---|---|
| 5,294,870 A | 3/1994 | Tang et al. | 313/504 |
| 5,708,130 A | 1/1998 | Woo et al. | 528/397 |
| 5,900,381 A | 5/1999 | Lou et al. | 501/54 |
| 5,936,347 A * | 8/1999 | Isaka et al. | 313/509 |
| 6,392,338 B1 * | 5/2002 | Hori et al. | 313/504 |
| 6,586,876 B2 * | 7/2003 | Tsai et al. | 313/509 |
| 2003/0047816 A1 * | 3/2003 | Dutta | 257/788 |
| 2003/0122480 A1 * | 7/2003 | Wei et al. | 313/506 |

FOREIGN PATENT DOCUMENTS

EP    0 969 699 A1    7/1999    .......... H05B/33/02

OTHER PUBLICATIONS

Lai et al., "Improved External Efficiency of Light Emitting Diode Using Organic Thin Film," CLEO Conference Proceedings, Pacific Rim 99, WL6, pp. 246–247 (1999).

Gu et al., "High –External–Quantum–Efficiency Organic Light–Emitting Devices," Optics Letters 6, vol. 22, pp. 396–398 (1997).

Gerrit Klarner et al., "Colorfast Blue Light Emitting Random Copolymers Derived from Di–n–hexylfluorene and Anthracene", 10 Adv. Mater. pp. 993–997 (1998).

Junji Kido et al., "Organic Electroluminescent Devices Based on Molecularly Doped Polymers", 61 Appl. Phys. Lett. pp. 761–763 (1992).

Chung–Chih Wu et al., "Efficient Organic Electroluminescent Devices Using Single–Layer Doped Polymer Thin Films with Bipolar Carrier Transport Abilities", 44 IEEE Trans. On Elec. Devices, pp. 1269–1282 (1997).

A.W. Grice et al., "High Brightness and Efficiency of Blue Light–Emitting Polymer Diodes", 73 Appl. Phys. Letters, pp. 629–631 (1998).

Hiroyuki Suzuki et al., "Near–ultraviolet Electroluminescence from Polysilanes", 331 Thin Solid Films, pp. 64–70 (1998).

(List continued on next page.)

*Primary Examiner*—Jay Patidar
(74) *Attorney, Agent, or Firm*—Toan P. Vo; Patrick K. Patnode

(57) ABSTRACT

An organic light emitting diode containing a first electrode, a second electrode, at least one organic light emitting layer, and an output coupler which reduces a Fresnel loss is provided. The index of refraction of the output coupler is matched to that of the adjacent layer of the device. The output coupler may be a dimpled transparent material or a composite layer containing light scattering particles to also reduce a critical angle loss.

34 Claims, 8 Drawing Sheets

OTHER PUBLICATIONS

P.S. Mudgett et al., "Multiple Scattering Calculations for Technology," 10 Appl. Optics, p. 1485–1502 (1971).

Madigan et al., "Improvement of Output Coupling Efficiency of Organic Light–Emitting Diodes by Backside Substrate Modification," Applied Physics Letters, vol. 76, No. 13, pp. 1650–1652 (2000).

Carr, "Photometric Figures of Merit for Semiconductor Luminescent Sources Operating in Spontaneous Mode," Infrared Physics, vol. 6, pp. 1–19 (1966).

Schnitzer et al., "30 % External Quantum Efficiency from Surface Textured, Thin–Film Light–Emitting Diodes," Appl. Phys. Lett. 63 (16), pp. 2174–2176 (1993).

Crawford et al., "Light–Emitting Diodes," Encyclopedia of Applied Physics, vol. 8, pp. 485–514 (1994).

* cited by examiner

ORGANIC ELECTROLUMINESCENT DEVICES WITH ENHANCED LIGHT EXTRACTION

This application claims the benefit of U.S. Provisional Application No. 60/194,068, filed Mar. 31, 2000, the disclosure of which is hereby incorporated by reference in its entirety.

BACKGROUND OF THE INVENTION

The present invention relates generally to lighting devices, and more particularly to an organic light emitting diode.

Organic electroluminescent devices, such as organic light emitting diodes (OLEDs), are currently used for display applications and are planned for use in general lighting applications. An OLED device includes one or more organic light emitting layers disposed between two electrodes, e.g., a cathode and a light transmissive anode, formed on a light transmissive substrate. The organic light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine to form excited molecules or excitons. The excited molecules or excitons emit light when they decay.

However, the external quantum efficiency of OLEDs, which is defined as a ratio of the photons emitted by the device to the number of injected electrons is lower than desired. There have been prior attempts to improve the external quantum efficiency of OLEDs by increasing the number of light beams that strike the substrate/air interface at an angle less than the critical angle.

For example Lai et al. (CLEO Conference Proceedings, Pacific Rim 99, WL6, pages 246–47 (1999)) suggests texturing the bottom light emitting surface of a glass substrate (i.e., the surface distal from the OLED device). The textured surface enables more light rays from the organic light emitting layer to strike the substrate/air interface at an angle smaller than the critical angle, thus allowing more light rays to escape from the substrate.

Furthermore, Gu et al. (22 Optics Letters 6, 396 (1997)) proposed forming deep grooves in the top surface of a glass substrate (i.e., the substrate surface adjacent to the OLED device). The glass/air interface of the grooves reflects the light emitted by the organic layer toward the bottom light emitting surface of the substrate. The reflected light increases the number of light beams that strike the bottom substrate surface/air interface at an angle less than the critical angle. Therefore, the total amount of transmitted light in increased. However, Gu et al. note that when the grooves were filled with a refractive index matching fluid (i.e., a fluid having the same refractive index as the substrate), the improvement in the external quantum efficiency is destroyed because the reflection of light at the groove/air interface is eliminated. Thus, the external quantum efficiency of an OLED having substrate grooves filled with an index matching liquid is the same as that of an OLED with a flat substrate. Furthermore, the device of Gu et al. has a low fill factor, which is defined as a ratio of the active device area to total device area. The device of Gu et al. has a maximum potential fill factor of 0.3 and an actual fill factor of the device illustrated in the Figures of this reference of 0.0085. While this fill factor is acceptable for display devices, a larger fill factor is desired for general lighting applications.

However, despite the efforts, the external quantum efficiency of OLEDs, such as those of Lai et al. and Gu et al., is still lower than desirable. The present invention is directed to overcoming or at least reducing the problem set forth above.

BRIEF SUMMARY OF THE INVENTION

In accordance with one aspect of the present invention, there is provided an organic electroluminescent light emitting device, comprising a first electrode, a second electrode, at least one organic light emitting layer, and an output coupler which reduces a Fresnel loss.

In accordance with another aspect of the present invention, there is provided an organic electroluminescent light emitting device, comprising a first electrode, at least one organic light emitting layer over the first electrode, a second transparent electrode over the at least one organic light emitting layer, and a shaped transparent material which has corrugated or dimpled light emitting surface and which contains nanoparticles having a size of less than 100 nm over the second transparent electrode.

In accordance with another aspect of the present invention, there is provided an organic electroluminescent light emitting device, comprising a first electrode, at least one organic light emitting layer over the first electrode, a second transparent electrode over the at least one organic light emitting layer, and a matrix material containing light scattering particles over the second electrode.

In accordance with another aspect of the present invention, there is provided a method of making an organic electroluminescent light emitting device, comprising placing a first material into a mold cavity, solidifying the first material to form a shaped transparent material having corrugated or dimpled first light emitting surface, and attaching the shaped transparent material to the an organic electroluminescent light emitting device.

In accordance with another aspect of the present invention, there is provided an organic electroluminescent light emitting device, comprising a first electrode, at least one organic light emitting layer over the first electrode, a second transparent electrode over the at least one organic light emitting layer, and a shaped transparent material whose index of refraction is selected to match that of an adjacent layer of the light emitting device.

BRIEF DESCRIPTION OF THE DRAWINGS

Other features and advantages of the invention will be apparent from the following detailed description of preferred embodiments and the accompanying drawings, in which.

DETAILED DESCRIPTION OF THE INVENTION

Figure 1:
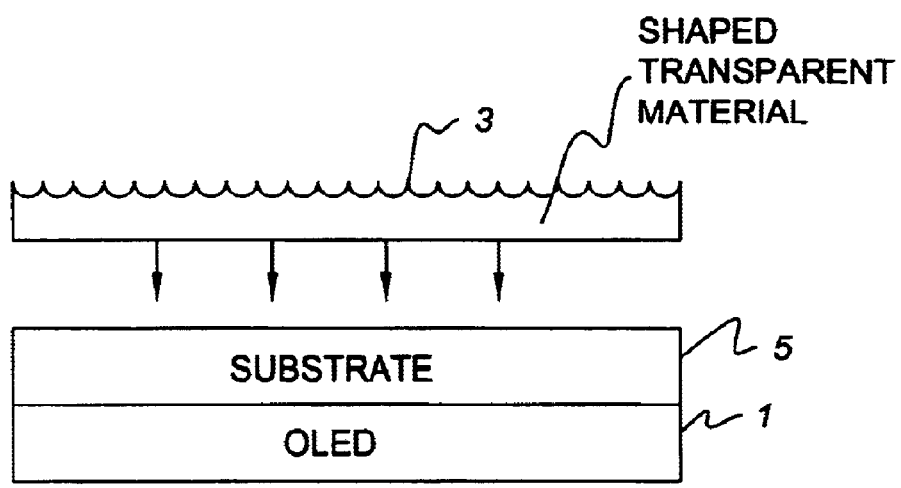
FIGS. 1–3 are drawings of an organic light emitting device containing an output coupler according to the first, second and third preferred embodiments of the invention.

The present inventors have realized that the less than desirable external quantum efficiency of prior art OLEDs is due to more than one factor. The external quantum efficiency of an organic electroluminescent device is typically much lower than its internal quantum efficiency due to the following factors: (i) the index of refraction mismatch between the device and the air into which the light is emitted, (ii) the index of refraction mismatch between the active device layers and the transparent substrate, and (iii) the critical angle loss resulting from a total internal reflection at the device/air interface. Hence, it is desirable to increase the external quantum efficiency so that it is as close as possible to the intrinsic internal quantum efficiency, especially for large area (e.g. >1 cm$^2$, such as about 1 in$^2$ to about 1 ft$^2$) organic electroluminescent devices.

The present inventors have recognized that the reasons for the reduction in external quantum can be expressed in terms of two mechanisms: a Fresnel loss and a critical angle loss. The Fresnel loss refers to the reduced transmission of light from the device (with index of refraction $n_1$) into the ambient medium or the transparent substrate (with index $n_2$) due to reflection at the boundary where there is an index of refraction mismatch between the device and the ambient medium or substrate. For normal incidence of light, the fraction $f_f$ of light that is transmitted from the device into the ambient medium or the substrate is given by the following equation:

$$f_f = \frac{4n_1 n_2}{(n_1 + n_2)^2} \quad (1)$$

Thus, as the difference in indices increases, the amount of light transmitted into the ambient medium or the substrate decreases. When the indices are equal, all of the light is transmitted. More complicated equations hold for other angles of incidence, but in all cases the trend of higher transmission with reduced index of refraction mismatch holds.

In most practical organic electroluminescent devices, the index of refraction of the ambient medium (e.g. air with index n=1) is less than that of the device and the substrate. In such cases, there is a critical angle loss which occurs due to total internal reflection at the device/air interface. In other words, only the light which is incident on the interface at an angle that is less than the critical angle is transmitted through the interface. The ratio $f_c$ of the light that gets transmitted through the interface relative to that which reaches the interface, assuming an isotropic angular distribution for the light, is given by the following equation.

$$f_c = 1 - \sqrt{1 - \left(\frac{n_2}{n_1}\right)^2} \quad (2)$$

Thus, as the index of refraction mismatch increases, the critical angle loss increases. Therefore, the magnitude of the critical angle is also dependent on the degree of the index mismatch.

Thus, the prior art attempts by Lai et al. and Gu et al. to improve the OLED external quantum efficiency by decreasing only the critical angle loss by texturing or grooving the substrate are insufficient to provide a desired value of the external quantum efficiency because they fail to account for the Fresnel loss. Thus, while the textured substrate surface of Lai et al. improves the external quantum efficiency by decreasing the critical angle loss at the substrate/air interface, the external quantum efficiency in the device of Lai et al. is lower than desired due to the index of refraction mismatch between the substrate and the adjacent ITO layer. The mismatch causes a Fresnel loss at the substrate and a results in a smaller than desired critical angle at the ITO/substrate interface, which leads to a larger than desired critical angle loss. Furthermore, the low fill factor device of Gu et al. is suitable for display application, but is lower than that desirable for lighting applications.

I. The Output Coupler

In contrast, the preferred aspects of the present invention provide an organic electroluminescent device containing an output coupler, which preferably comprises a shaped transparent material onto the light emitting surface of the device. The output coupler reduces an index of refraction mismatch between the electroluminescent device and the output coupler, which reduces the Fresnel loss and the critical angle loss at the device/coupler interface. In addition, the output coupler reduces the critical angle loss resulting from a total internal reflection at the device/air interface by providing a textured surface or light scattering particles. In a preferred aspect of the present invention, the electroluminescent device comprises an organic light emitting diode and the index of refraction of the output coupler is matched to an index of refraction of a layer adjacent (i.e., the outermost device layer, such as a transparent electrode or a transparent substrate) to the output coupler. For example, the index of refraction of the output coupler is the same as or close to an index of refraction of the adjacent layer of the electroluminescent device. In one preferred aspect of the present invention, an index of refraction of the output coupler which differs by less than 0.1, preferably by less than 0.01, from the index of refraction of the device is considered "matched to" or "close to" the index of refraction of the adjacent device layer.

In a first and second preferred embodiments of the present invention, the external quantum efficiency of large area organic electroluminescent device is increased by attaching an output coupler comprising a shaped transparent material onto the emitting surface of the device. The output coupler can comprise any transparent material, such as polymer or glass, which has a transparency above 80%, preferably above 95%, most preferably above 99%. For example, the output coupler can comprise a glass material, such as BK7, F2, SF1 or SF2 glasses available from the Schott Co. These glasses have a refractive index of 1.517, 1.62, 1.72 and 1.65 respectively, for incident light having a wavelength of 589.3 nm. Alternatively, the output coupler may comprise a polymer material. For example, the output coupler may comprise a polycarbonate based material, such as Lexan® 4501 from GE and Ultrason® from BASF Inc. These materials have a refractive index of 1.6 and 1.65, respectively. The output coupler may also comprise a silicone or epoxy, such as the XE5844 silicone available from GE/Toshiba.

The transparent material is shaped such that its top surface is modulated or textured, or has dimples or corrugations, which reduce the amount of light lost through total internal reflection due to the critical angle loss mechanism. This shaped transparent material increases the external quantum efficiency of the device by reducing the critical angle losses at the device surface. Light paths that were previously internally reflected at the flat device surface can reach a side of a dimple or corrugation, perhaps even after a few internal reflections. This allows the light paths that strike the side of the dimple or corrugation to escape the device since their angle of incidence is now less than the critical angle with respect to the side or the dimple or corrugation.

Furthermore, in contrast to the prior art devices, such as the device of Lai et al., the index of refraction of the shaped transparent material matches that of the device. Preferably the shaped transparent material is filled with high index nanoparticles such that the index of refraction of the material matches that of the adjacent layer of the device. Alternatively, the shaped transparent material may comprise various transparent glasses which do not include the nanoparticles, and whose index of refraction is selected to match that of the device. For example, the output coupler may comprise the SF1 glass having a refractive index of 1.72, while the adjacent layer of the OLED may comprise indium tin oxide (ITO) having a refractive index of 1.8 to 2.05. Thus, such an output coupler reduces the Fresnel loss and the critical angle loss and the device/coupler interface due to the index of refraction matching, and in addition also reduces the critical angle loss at the coupler/air interface due to the corrugated or dimpled surface.

In a preferred aspect of the first and second embodiments, the nanoparticles comprise high refractive index particles such as $TiO_2$ or ZnO. Alternatively, other nanoparticles, such as diamond, $Al_2O_3$, $SiO_2$, $Y_2O_3$, $Y_3Al_5O_{12}$ ("YAG"), $CaCO_3$ or $BaSO_4$ may be used instead. Preferably, the mean particle size (i.e., $d_{50}$) of the nanoparticles is less than 100 nanometers, most preferably less than 50 nm, to eliminate scattering effects and ensure transparency of the shaped transparent material. By selecting the desired particle size and the amount of particles, the index of the resulting transparent layer matrix/particle filler composite can be adjusted between the values of the pure matrix and the pure filler.

According to the first preferred embodiment of the present invention, the output coupler is attached to a completed organic electroluminescent device. This can be accomplished by attaching an output coupler comprising a shaped transparent material 3 to the surface of the organic electroluminescent device, such as an OLED 1, as shown in FIG. 1. The shaped transparent material 3 typically has an index of refraction which is matched to or close to the index of refraction of the portion of the device 1 to which it is attached. For example, if the material 3 is attached to the substrate 5 of the OLED device 3, then the index of refraction of the material 3 is matched to that of the substrate 5. If the material 3 is attached to an active layer of the organic electroluminescent device 1, such as a transparent electrode or the organic light emitting layer, then the index of refraction of the material 3 is matched to that of the active layer.

The shape of the material 3 to be attached is preferably flat on the side of attachment and dimpled or corrugated on the side from which light is emitted into the ambient environment. The height of the corrugations or dimples is preferably greater than 0.1 micron, most preferably greater than 1 micron. Preferably the dimples or corrugation cover the whole surface of material 3, but may cover only a portion of the surface of the material 3, such as the light emitting portion. The spacing between dimple or corrugation peaks is preferably within a factor of 10, most preferably within a factor of 5, of their height. The spacing may conform to a regular pattern. However, the spacing does not have to conform to a regular pattern.

In a preferred aspect of the first preferred embodiment, the shaped transparent material 3 comprises any thermoplastic, thermoset, or elastomer material that is transparent, and can be molded into the desired structure. A thermoplastic, thermoset, or elastomer material, such as a polymer or a glass material, is placed into a mold cavity having a corrugated or dimpled surface. The material is then solidified to form the shaped transparent material 3 having corrugated or dimpled first light emitting surface. The index of refraction of the material 3 can be adjusted to match that of the surface of the electroluminescent device by mixing nanoparticles of high refractive index, such as $TiO_2$ or ZnO particles, into the thermoplastic, thermoset, or elastomer material before or after the material is placed into the mold. In this manner, the index of the resulting composite can be adjusted between the values of the pure polymer (or glass) and the pure filler (i.e., the nanoparticles).

The shaped transparent material 3 can be attached to the surface of the electroluminescent device 1 by means of a transparent adhesive, such as an epoxy. Suitable epoxies include the NOA 60, 61 and 81 epoxies from Norland Optical and the J91 epoxy from Summers Laboratories. Such epoxies generally have an index of refraction of about 1.55 to about 1.56. It is typically desirable that the epoxy have close to the same index of refraction as that of the device surface. This can be achieved by also filling the epoxy with a specific amount of nanoparticles. Furthermore, while in a preferred aspect of the first embodiment the shaped transparent material 3 is attached to the substrate 5 after the OLED device 5 is formed on the substrate, the shaped transparent material 3 may be attached to the substrate 5 before the OLED device 1 is formed on the substrate.

Figure 2:
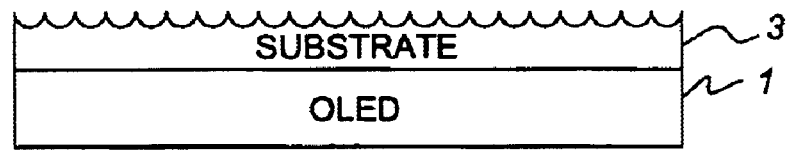

According to the second preferred embodiment of the present invention, the substrate 5 is omitted and the OLED device 1 is instead formed on the shaped transparent material 3, as illustrated in FIG. 2. Thus, the substrate 5 of the organic electroluminescent device 1 is replaced with the shaped transparent material 3. The organic electroluminescent device 1 is fabricated onto the shaped transparent material 3 rather than onto the substrate 5 as described in more detail below. Alternatively, the completed device 1 may be attached directly to the material 3, if the substrate 5 is omitted or located on the non-light emitting surface of the device 1.

In this embodiment, the index of refraction of the shaped transparent material 3 preferably is matched to the emitting layer of the organic electroluminescent device 1, rather than to the substrate. In other words, the index of refraction of the shaped transparent material 3 is matched to the adjacent layer (i.e., the layer that contacts material 3) of the device 1, such as an ITO transparent electrode or the organic light emitting layer, depending on the layout of the device 1. The index of refraction of the material 3 may be matched to that of the device 1 by filling a polymer or glass material 3 with nanoparticles or by selecting a glass material 3 whose index of refraction matches that of the device.

The omission of the substrate in the second embodiment is advantageous because the external quantum efficiency of the device 1 of the second embodiment is greater than that of the first embodiment, when the index of refraction of the substrate 5 is not matched to that of the underlying active device layer, which causes critical angle and Fresnel losses at the device/substrate interface. Thus, the Fresnel and critical angle losses at the device 1/substrate 5 interface of the first embodiment are eliminated by eliminating the substrate 5.

Figure 3:
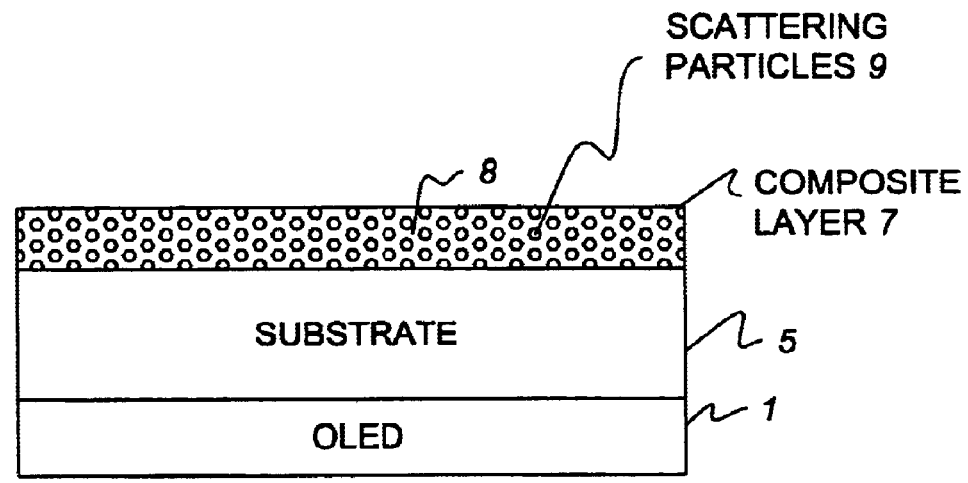

According to the third preferred embodiment of the present invention, the shaped transparent material 3 is replaced with a composite layer 7, as illustrated in FIG. 3. The composite layer 7 preferably comprises a matrix material 8 (e.g. an epoxy, silicone or other polymer materials) filled with scattering particles 9, such as titania or zinc oxide. However, other scattering particles 9, such as diamond, $Y_2O_3$, YAG, $Al_2O_3$, $SiO_2$, $CaCO_3$ and $BaSO_4$ may be used instead. The scattering particles 9 typically have a particle size which results in effective scattering of light emitted from the device 1. Preferably, the particles have an average size (i.e., a mean diameter, $d_{50}$) of 0.1 to 20 microns, preferably 1 to 10 microns. If desired, some or all light scattering particles 9 may be replaced with light scattering voids in the matrix material 8.

The light scattering particles 9 (or voids) decrease the critical angle loss at the layer/air interface by redirecting the light beams at the interface in plural directions. Thus, a higher portion of the scattered light will eventually be incident on the interface at an angle less than the critical angle.

The matrix material 8 preferably also includes nanoparticles (not shown in FIG. 3), such as titania or zinc oxide, having a size less than 100 nanometers to adjust the index of refraction of the composite layer 7 such that it is equal to or close to the index of refraction of the substrate 5. However, if desired, the substrate 5 may be omitted as in the second embodiment. In this case, the index of refraction of the composite layer 7 is matched to that of the emitting layer of the device 1, as in the second embodiment. If desired, the light emitting surface of the composite layer 7 may contain the dimples or corrugations, as illustrated in FIGS. 1 and 2, in order to further reduce the critical angle loss and the layer/air interface.

The composite layer 7 is preferably attached to the substrate 5 of the organic electroluminescent device 1 before or after the device 1 is formed on the substrate 5. The device 1 may be directly formed on the composite layer 7 if the substrate 5 is omitted, or the completed device 1 may be attached directly to the layer 7 if the substrate 5 is omitted or located on the non-light emitting surface of the device 1.

II. The Components of the OLED Device

Figure 4:
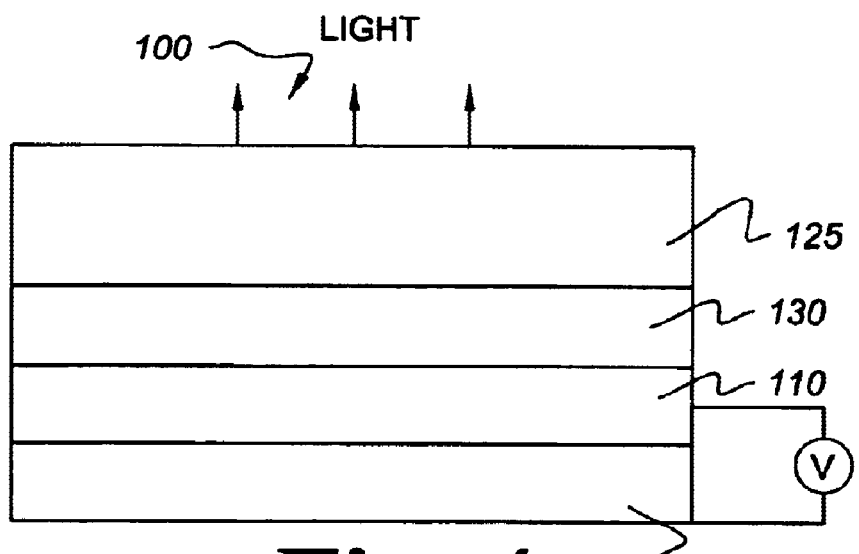
FIG. 4 is a drawing of an organic light emitting device according to one preferred embodiment of the invention.

The organic electroluminescent device 1 may comprise any type of organic light emitting device, such as an OLED. The term "light" includes visible light as well as UV and IR radiation. The device 100 according to one preferred aspect of the present invention is illustrated in FIG. 4. The organic light emitting device 100 includes an organic light emitting layer 110 disposed between two electrodes, e.g., a cathode 120 and an anode 130. The organic light emitting layer 110 emits light upon application of a voltage across the anode and cathode from the voltage source "V". The organic light emitting device 100 typically includes a device substrate 125, such as glass or transparent plastics such as PET (MYLAR®), polycarbonate, and the like, as shown in FIG. 4. The term "organic light emitting device" generally refers to the combination which includes the organic light emitting layer, the cathode, and the anode, and which may also include other elements such as the device substrate, device electrical contacts, and a photoluminescent layer, as will be described below.

A. The Electrodes

The anode and cathode inject charge carriers, i.e., holes and electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the organic light emitting device 100. The anode 130 may comprise, for example, indium tin oxide (ITO), tin oxide, nickel, or gold. The electrodes 120, 130 can be formed by conventional vapor deposition techniques, such as evaporation or sputtering, for example.

B. The Organic Emitting Layer(s)

A variety of organic light emitting layers 110 can be used in conjunction with exemplary embodiments of the invention. According to one embodiment shown in FIG. 4, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 5–8, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 4, will now be described. According to one embodiment, the organic light emitting layer 110 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 110 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference. Another preferred blue light emitting polyfluorine is poly(9,9-di-n-hexylfluorine-2,7-diyl) which has a broad double emission peak between about 415 and 460 nm.

According to a another embodiment of a single layer device as shown in FIG. 4, the organic light emitting layer 110 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum (III) (Alq). TDP has a high hole drift mobility of $10^{-3}$ cm$^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 5:
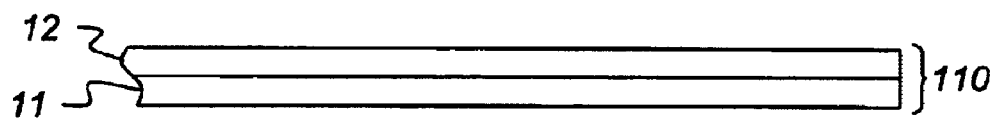
FIGS. 5–8 illustrate various examples of organic light emitting layers formed of two or more sublayers.

According to another embodiment of the invention shown in FIG. 5, the organic light emitting layer 110 comprises two sublayers. The first sublayer 11 provides hole transport, electron transport, and luminescent properties and is positioned adjacent the cathode 120. The second sublayer 12 serves as a hole injection sublayer and is positioned adjacent the anode 130. The first sublayer 11 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 12 serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 6:
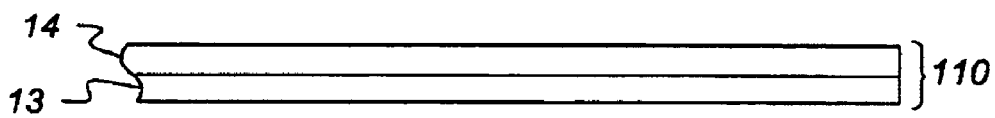

According to another embodiment of the invention shown in FIG. 6, the organic light emitting layer 110 includes a first sublayer 13 comprising a luminescent sublayer and a second sublayer 14 comprising a hole transporting sublayer. The hole transporting sublayer 14 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 7:
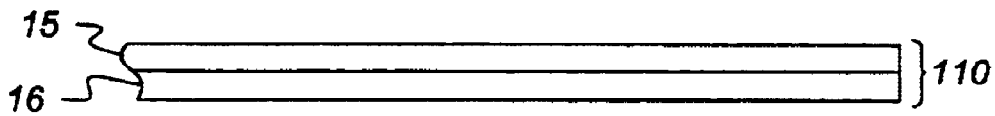

According to another embodiment of the invention shown in FIG. 7, the organic light emitting layer 110 comprises a first sublayer 15 which includes luminescent and hole transport properties, and a second sublayer 16 which includes electron injection properties. The first sublayer 15 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methyl-phenylsilane) (PMPS), and poly[-bis(p-butylphenyl)silane] (PBPS). The polysilane sublayer 15 can be applied by spin coating from a toluene solution, for example. The electron injection sublayer 16 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 8:
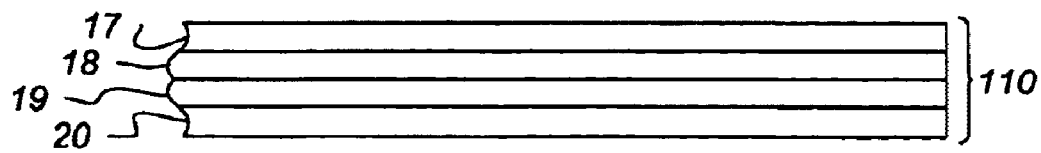

According to another embodiment of the invention shown in FIG. 8, the organic light emitting layer 110 comprises a hole injecting sublayer 17, a hole transporting sublayer 18, a luminescent sublayer 19, and an electron injecting sublayer 20. The hole injecting sublayer 17 and hole transporting sublayer 18 efficiently provide holes to the recombination area. The electrode injecting sublayer 20 efficiently provides electrons to the recombination area.

The hole injecting sublayer 17 may comprise a porphyrinic compound, such as a metal free phthalocyanine or a metal containing phthalocyanine, for example. The hole transporting sublayer 18 may comprise a hole transporting aromatic tertiary amine, where the latter is a compound containing at least one trivalent nitrogen atom that is bonded only to carbon atoms, at least one of which is a member of an aromatic ring. The luminescent sublayer 19 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 20 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design an organic light emitting device which emits in one or more desired colors. For example, the organic light emitting device 100 can emit ultraviolet, blue, green, or red light.

C. Sealing Member and Contacts

Figure 9:
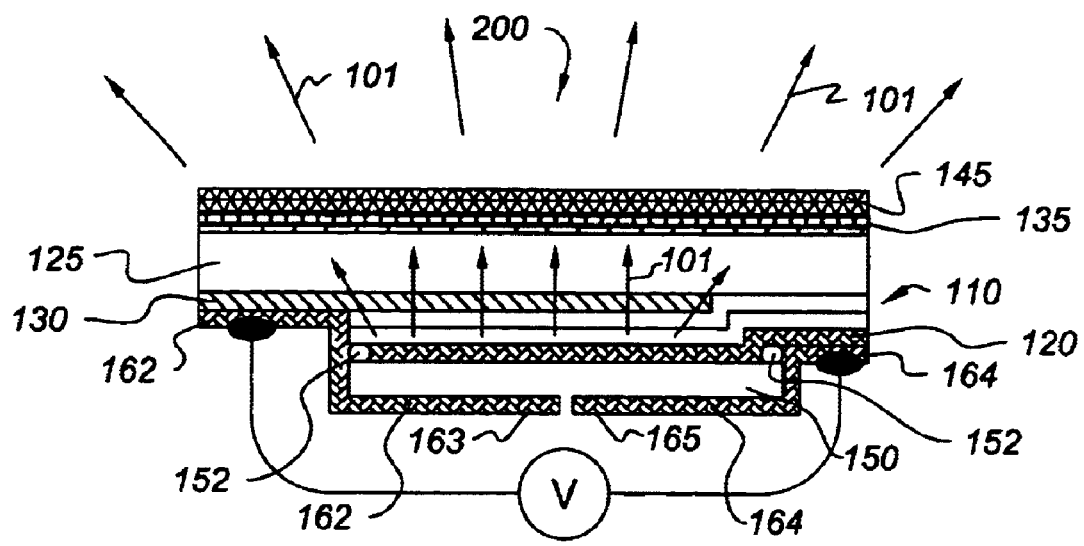
FIG. 9 is a side view of an organic light emitting device according to another preferred embodiment of the invention.
Figure 10:
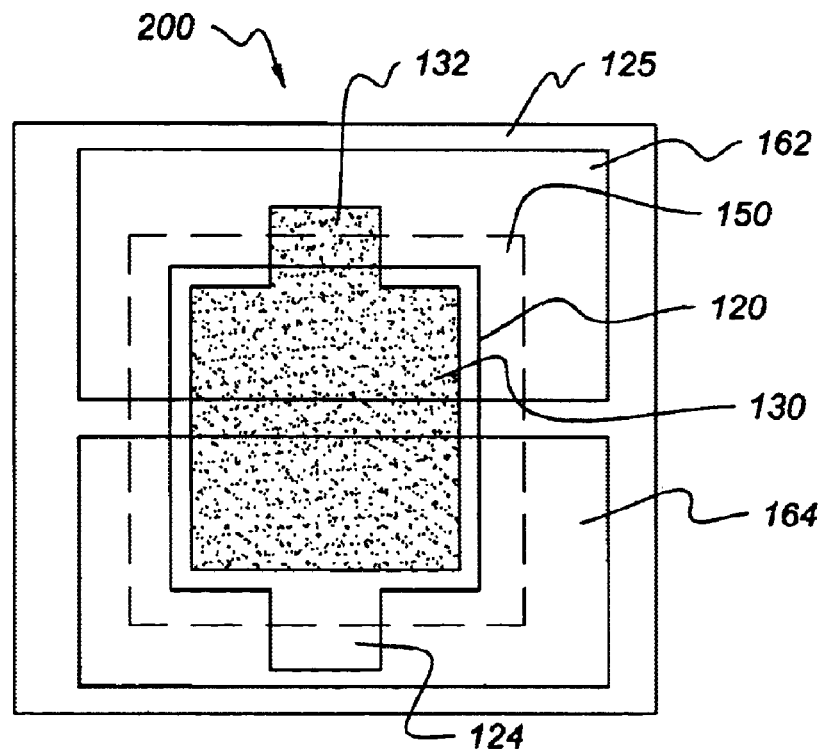
FIG. 10 is a bottom view of the organic light emitting device of FIG. 9.

Referring to FIGS. 9 and 10, an organic light emitting device is shown according to another embodiment of the invention. The organic light emitting device 200 comprises an organic light emitting layer 110, a cathode 120, and an anode 130 which is light transmissive. The organic light emitting device 200 also includes a device substrate 125 which is light transmissive. The elements in FIGS. 9 and 10 (e.g. the anode 130, cathode 120, light emitting layer 110) corresponding to those in FIG. 4 can be formed of the same materials as described above with respect to FIG. 4. Upon application of a voltage, light (represented by arrows 101) is generated in the light emitting layer 110 and propagates through the anode 130 and the device substrate 125.

Adjacent to the cathode 120 is a sealing member 150, typically comprising glass, which provides a barrier to oxygen and water. The sealing member 150, in conjunction with a sealant 152 which may comprise epoxy, a metal, or a glass frit, for example, provides a near hermetic barrier to prevent water and oxygen penetration into the cathode 120, anode 130 and organic light emitting layer 110.

Formed adjacent to the sealing member 150 are first and second device electrical contacts 162, 164, which provide electrical connections to the anode 130 and cathode 120, respectively. As shown most clearly in FIG. 10, the first device electrical contact 162 connects electrically to the anode 130 in a tab region 132 of the anode 130. The tab region 132 is beyond the perimeter of the sealing member 150. The second device electrical contact 164 connects electrically to the cathode 120 in a tab region 124 of the cathode 120. The tab region 124 is beyond the perimeter of the sealing member 150. The organic light emitting layer 110 (not shown in FIG. 10) typically occupies at least the overlap region of the anode 130 and cathode 120 and may extend beyond these electrodes.

Referring again to FIG. 9, the device electrical contacts 162, 164 typically have respective device contacting surfaces 163, 165 which occupy a common plane. These device contacting surfaces 163, 165 facilitate the mounting of one or more organic light emitting devices 200 onto a mounting substrate, as will be described further below in connection with FIG. 9.

An advantageous feature of the device electrical contacts 162, 164 can be described with reference to an imaginary surface running through the light emitting layer 110. The imaginary surface, which is typically planar, divides the organic light emitting device 200 into a first side and a second side. The anode 130 is on the first side, and the cathode 120 is on the second side. The light is emitted through the first side, and the device electrical contacts 162, 164 extend to the second side. For example, the first device electrical contact 162 extends from the anode 130 on the first side to the second side of the organic light emitting device. The second device electrical contact 164 extends from the cathode 120 on the second side to another location on the second side of the organic light emitting device. Thus, the organic light emitting device 200 can be powered by contacting both device electrical contacts 162, 164 on a common planar surface 163, 165 which is on an opposite side of the organic light emitting device as where the light emission occurs. Typically the planar surface defined by surfaces 163, 165 is parallel to the light emitting layer 110 and the device substrate 125. This configuration allows a number of organic light emitting devices 200 to be easily mounted adjacent to each other ("tiled") on a mounting substrate.

As shown in FIG. 10, the device substrate 125 can define the area of the organic light emitting device 200. The first and second device electrical contacts 162, 164 can occupy an area which is within the area of the device substrate 125. Therefore, two organic light emitting devices 200 can be placed directly adjacent to each other without any electrical connectors in between and with a small separation distance between the adjacent light emitting device substrates 125. For example, if desired, the separation distance could be less than 2 centimeters (cm), 1 cm, 0.5 cm or 0.25 cm, but is typically greater than 0.1 cm.

D. The Photoluminescent Layer

As shown in FIG. 9, the organic light emitting device 200 may optionally include a photoluminescent layer 135. The photoluminescent layer 135 comprises a photoluminescent material which absorbs light from the organic light emitting layer 110 and emits light typically having a longer wavelength. The photoluminescent material typically comprises an inorganic phosphor, but may also comprise an organic photoluminescent material such as an organic dye. Examples of phosphor materials that can be utilized include those phosphors based on cerium doped into a $Y_3Al_5O_{12}$ (YAG) lattice which crystallizes in the garnet structure. Specific examples include $(Y_{1-x-y}Gd_xCe_y)_3Al_5O_{12}$ (YAG:Gd,Ce), $(Y_{1-x}Ce_x)_3Al_5O_{12}$ (YAG:Ce), $(Y_{1-x}Ce_x)_3(Al_{1-y}Ga_y)_5O_{12}$ (YAG:Ga,Ce) and $(Y_{1-x-y}Gd_xCe_y)_3(Al_{5-z}Ga_z)_5O_{12}$ (YAG:Gd,Ga,Ce) and $(Gd_{1-x}Ce_x)Sc_2Al_3O_{12}$ (GSAG). The YAG phosphors can be described generally as $(Y_{1-x-y}Gd_xCe_y)_3(Al_{1-Z}Ga_Z)_5O_{12}$, wherein $x+y \leq 1$; $0 \leq x \leq 1$; $0 \leq y \leq 1$; and $0 \leq z \leq 1$. The position of the peak of the emission band varies considerably in the aforementioned phosphors. Depending on the garnet composition, the $Ce^{3+}$ emission can be tuned from the green (~540 nm; YAG:Ga, Ce) to the red (~600 nm; YAG:Gd:Ce) without appreciable loss in the luminescence efficiency.

An appropriate phosphor material or blend of phosphor materials in combination with a organic light emitting device 100, such as a blue or a UV light emitting device, can produce a white field corresponding to a wide range of color temperatures. Light sources in the form of large area white light electroluminescent panels (i.e., having a size of greater than 1 square meter) which closely approximate the color, CRI, and brightness of conventional fluorescent lamps can be made with such phosphors and organic light emitting devices.

For example, a preferred organic blue light emitting polymer layer 110 is poly(9,9-di-n-hexylfluorene-2,7-diyl) and the preferred phosphor material is (YAG:Ce), which absorbs the blue light and emits yellow light, the combination of which appears white to a human observer. The preferred anode material is ITO and the preferred cathode material is the LiF/Al bilayer. The relative weighting of the components is chosen such that the white light is on the blackbody locus (as desired for illumination applications) with a color temperature of 6050K. The expected color rendition index (CRI) is calculated to be >70, preferably 74. The color temperature can be adjusted to vary between 3500K and 6500K on the black body locus by varying the phosphor thickness and composition. The output coupler is projected to eliminate up to 60 to 80% of the internal reflection losses. The device size may range from 2.5 to 10 $cm^2$ up to 0.3 m×0.3 m (i.e., 1 $ft^2$). Furthermore, the individual devices may be assembled or tiled onto a common substrate having an area of up to 3.6 $m^2$ (0.6 m×0.6 m), when individual device areas range from 15 cm×15 cm to 0.3 m×0.3 m.

Another yellow emitting phosphor which may be used with the blue emitting OLED to produce white light is manganese doped zinc sulfide ($ZnS:Mn^{2+}$). It should be noted that some of the zinc may be substituted by cadmium. Alternatively, yellow emitting dye(s), such as Fluorol 7GA or Rhodamine 110, may be used with the blue OLED to produce white light. These dyes are available from Lambda Physik, Inc. of Fort Lauderdale, Fla.

In addition, more than one phosphor or dye material may be combined together and then utilized with an organic light emitting device to achieve different colors (i.e., white or other colors), color temperatures, and color rendition indices. Other phosphors which can be used are described in U.S. Ser. No. 09/469,702, entitled "Luminescent Display and Method of Making", filed Dec. 22, 1999, in the name of Anil Duggal and Alok Srivastava, which is hereby incorporated by reference. An example of a suitable red emitting inorganic phosphor is $SrB_4O_7:Sm^{2+}$, where the $Sm^{2+}$ following the colon represents an activator. This phosphor absorbs most visible wavelengths shorter than 600 nm and emits light as a deep red line with a wavelength greater than 650 nm. An example of a suitable green emitting inorganic phosphor is $SrGa_2S_4:Eu^{2+}$. This phosphor absorbs below 500 nm and has a maximum emission at 535 nanometers. An example of a suitable blue emitting inorganic phosphor is $BaMg_2Al_{16}O_{27}:Eu^{2+}$. $BaMg_2Al_{16}O_{27}:Eu^{2+}$ absorbs most wavelengths below 430 nm and has a maximum emission at 450 nm. Examples of organic dyes which can be utilized in the photoluminescent layer include coumarin 460 (blue), coumarin 6 (green), and nile red.

An alternative way of generating white light from the organic light emitting device without using a phosphor or a dye layer 135 is to utilize a full color display with separately addressable color pixels and tune the colors to emit white light. This approach allows color tunability but increases complexity and cost. Furthermore, instead of using separately addressable color pixels, a blend of various dye molecules and/or polymers that emit different colors can be placed into the active region of a device to achieve white light. This approach has the advantage of simple, low cost, fabrication. However, different organic components in the device can age differently, which leads to a color shift with time. In contrast, the use of the phosphor layer 135 is advantageous because the device does not suffer from color shifts due to differential aging of different organic molecular and polymer components.

If a separate luminescent material 135 is present over the substrate 125, then the output coupler 145 is preferably formed over the luminescent material 135, as illustrated in FIG. 9. Thus, the output coupler 145 is used as a sealing layer to preserve the luminescent material 135, especially if the output coupler comprises a glass material and the luminescent material comprises a dye. A silicone or epoxy sealant may also be used around the edges of the output coupler 145 to seal the luminescent material. The index of refraction of the output coupler 145 is preferably matched to that of the luminescent layer 135. If the output coupler comprises a polymer material, then it is desirable to add a sealing material, such as a glass plate (not shown), between the luminescent layer 135 and the polymer output coupler 145.

Alternatively, the luminescent material 135, such as a phosphor, can be incorporated directly into the output coupler. For example, the phosphor may be dispersed in the polymer transparent material 3 or matrix material 8 of FIGS. 1 and 3. This is advantageous because it eliminates a possible index of refraction mismatch between separate phosphor and output coupler layers.

The organic light emitting device 200 may also include an optional scattering layer comprising scattering particles such as $TiO_2$ or $SiO_2$ for effective color mixing and brightness uniformity. However, the scattering particles are preferably mixed into the photoluminescent layer 135 or are integrated as part of the output coupler, such as the composite layer 7 illustrated in FIG. 3, rather than being formed as a separate layer.

III. Method of Making the OLED Device

Figure 11:
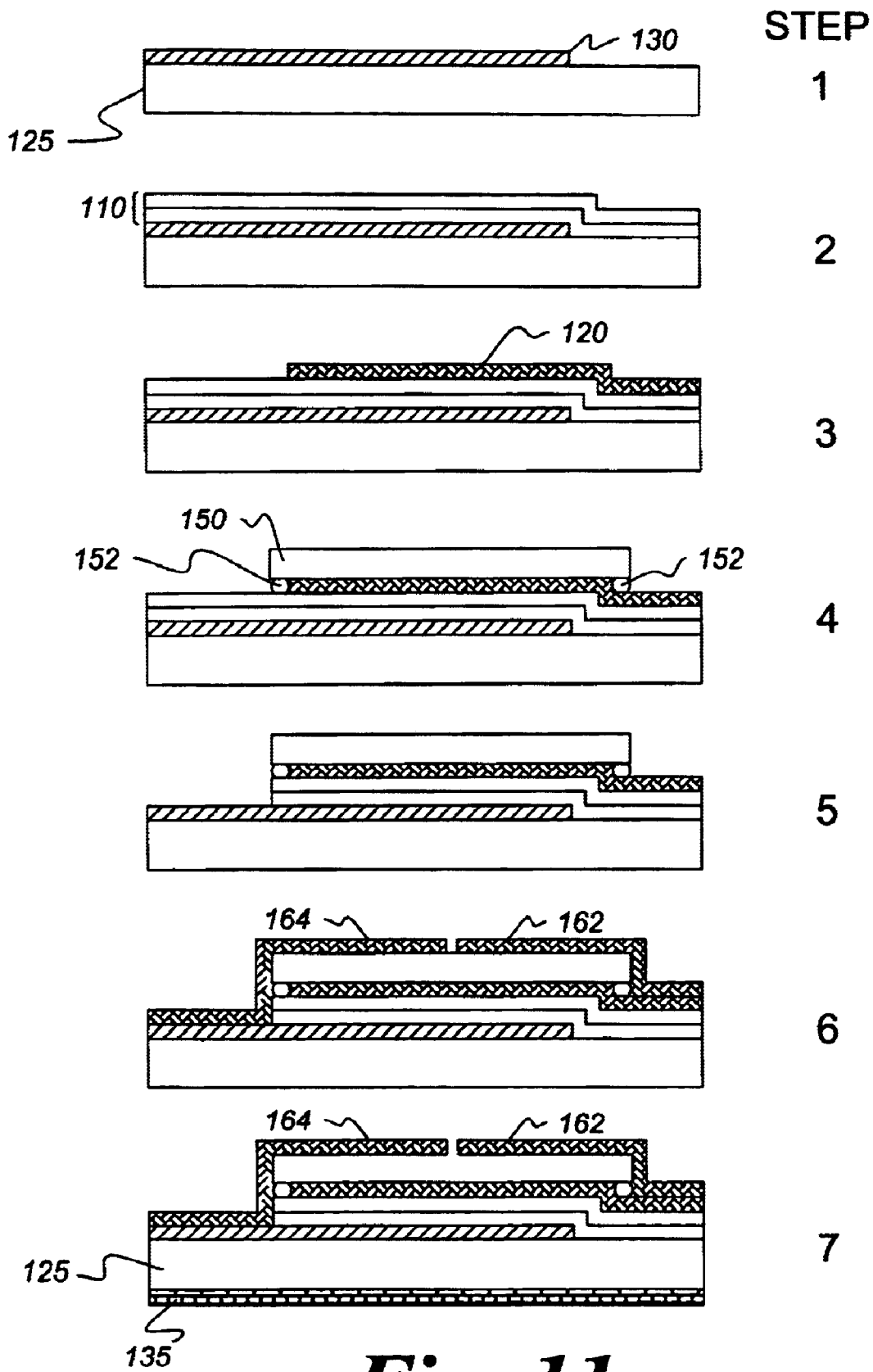
FIG. 11 illustrates a method of making the organic light emitting device of FIG. 9 according to a preferred embodiment of the present invention.

FIG. 11 illustrates a method for forming the organic light emitting device 200 of FIGS. 9 and 10 according to an exemplary embodiment of the invention. As shown in FIG. 11, step 1, a glass substrate 125 is sputter coated with a layer of thin indium tin oxide (ITO). The ITO is then patterned to form the anode 130, e.g. in the pattern shown in FIG. 10. In step 2, the organic light emitting layer 110 (which may include one or more sublayers as shown in FIGS. 4–8) is deposited, for example by spin coating or inkjet processing. In step 3, the cathode 120 is deposited as a reflective structure comprising a thin layer of lithium fluoride overcoated with aluminum, for example. The cathode 120 can be deposited through a stencil mask by evaporation, for example. The sealing member 150, which may comprise glass, for example, is next applied with a sealant 152 in step 4 to form a near hermetic barrier.

In step 5, the organic light emitting layer 110 extending beyond the sealing member 150 is removed by solvent or dry etching methods. The device electrical contacts 162, 164, which may comprise a metal such as aluminum or silver, are then applied to the reflective side of the organic light emitting device 200 in step 6. The device electrical contacts 162, 164 allow for external contact to the organic light emitting device and additionally can provide a near hermetic seal to the anode 130, cathode 120, and light emitting layer 110. In step 7, optionally, a layer 135 of photoluminescent material, e.g. an inorganic phosphor, is applied to the device substrate 125. Optionally, a layer of scattering particles can be applied in a subsequent step. The steps shown in FIG. 11 are of course merely an example of a method of making a light source, and not intended to be limiting.

After the device 100 is completed, an output coupler 145, such as the shaped transparent material 3 of FIG. 1 or the composite layer 7 of FIG. 3 is attached to the substrate 125. If the luminescent material 135 is present over the substrate 125, then the output coupler is formed over the luminescent material 135. Alternatively, the luminescent material 135, such as a phosphor can be incorporated into the output coupler. For example, the phosphor is dispersed in the polymer transparent material 3 or matrix material 8 of FIGS. 1 and 3. Furthermore, the output coupler, such as the transparent material 3 or the composite layer 7 may be used as the substrate, and the substrate 5, 125 may be eliminated, as illustrated in FIG. 2.

Figure 12:
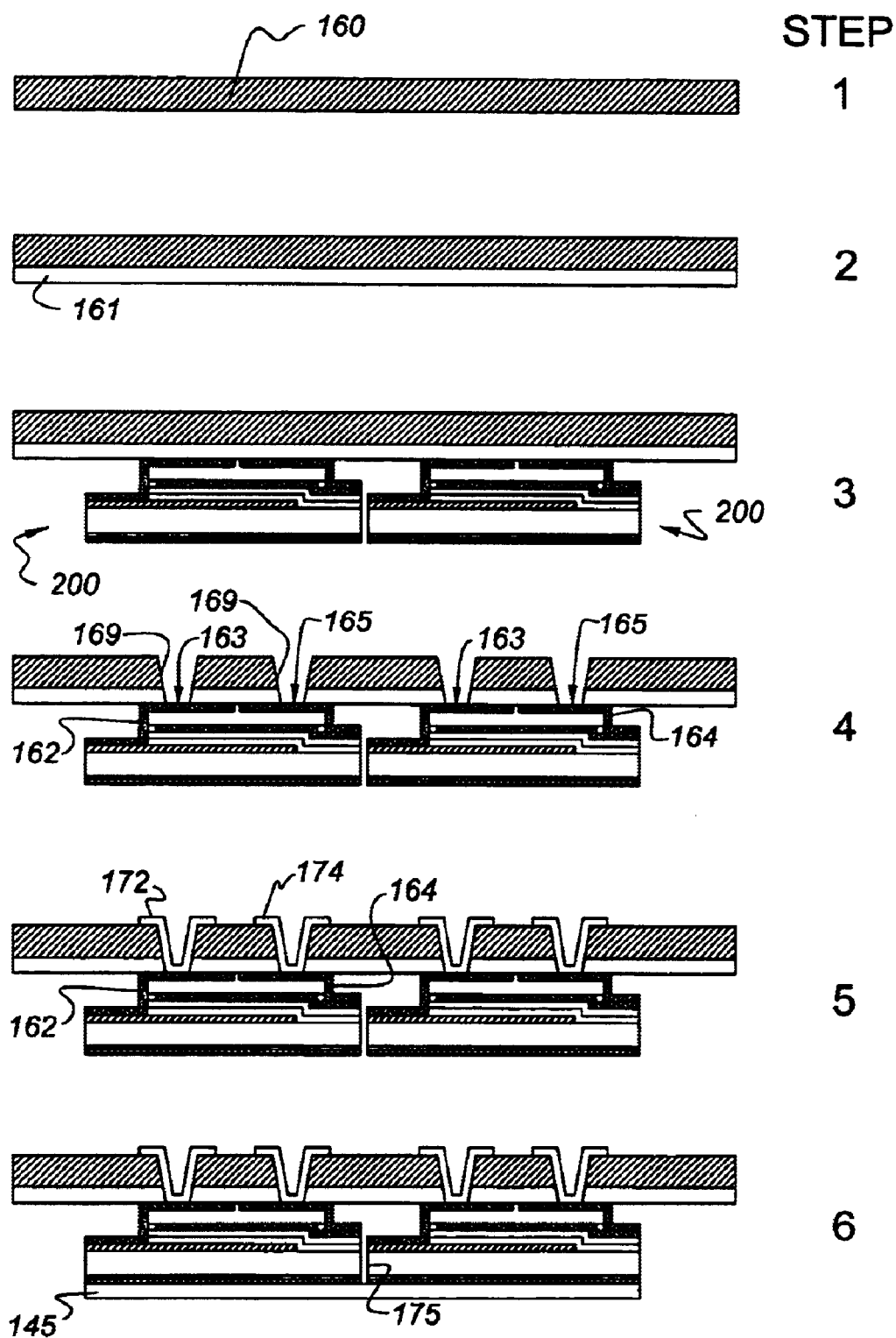
FIG. 12 illustrates a method of mounting a plurality of light emitting devices on a mounting substrate to produce a light source according to a preferred embodiment of the invention.

FIG. 12 illustrates a method of mounting one or more organic light emitting devices onto a mounting substrate to form a light source according to an exemplary embodiment of the invention. The term "light source" generally refers to the combination of at least one, and usually many, organic light emitting devices 200 mounted on a mounting substrate. Step 1 shows the mounting substrate 160, which may comprise a conventional printed circuit board such as FR4 or GETEK, or a flexible polymer film such as Kapton E™ or Kapton H™ polyimide (Kapton is a trademark of E. I. Du Pont de Nemours & Co.), Apical AV polyimide (Apical is a trademark of Kanegafugi Chemical Company), or Upilex polyimide (Upilex is a trademark of UBE Industries, Ltd) for example. In one embodiment, free-standing Kapton™ polyimide is mounted on a rigid frame (not shown in FIG. 12) which rigidly supports the flexible film during processing and for end use if desired. An adhesive, typically comprising a material capable of adhering at a low temperature, can be applied to the rigid frame. Examples of suitable adhesives include materials such as ULTEM polyetherimide (ULTEM™ is a trademark of General Electric Company) and MULTIPOSIT™ XP-9500 thermoset epoxy (MULTIPOSIT is a trademark of Shipley Company Inc., Marlborough, Mass.).

In step 2, according to one embodiment, another adhesive 161, which is typically organic, such as ULTEM™, SPIE (siloxane polyimide epoxy) or other polyimide and epoxy blends, or cyanoacrylate is applied to the mounting substrate 160, as shown in FIG. 12. In step 3, one or more organic light emitting devices 200 are placed on the adhesive 161, and the adhesive is cured to bond the organic light emitting devices 200 to the mounting substrate 160.

In step 4, vias 169 are formed using laser ablation or reactive ion etching, for example, through the mounting substrate 160 and the adhesive 161 to the device contacting surfaces 163, 165 of the device electrical contacts 162, 164, respectively. In step 5, first and second mounting electrical contacts 172, 174 are formed or inserted into the via holes 169 to make contact with the device electrical contacts 162, 164, respectively. The mounting electrical contacts 172, 174 can be formed as a patterned metal layer using sputter or electroless plating techniques, in combination with electroplating if desired, and patterned with a standard photoresist and etch process. The interconnect metallization in one embodiment comprises a thin adhesion layer of 1000 angstroms (Å) sputtered titanium, coated by a thin layer of 3000 Å sputtered copper, coated by a layer of electroplated copper to a thickness of 4 microns, for example. An optional buffer layer of 1000 Å of titanium can be applied over the electroplated copper. The mounting electrical contacts 172, 174 can also be applied by the conventional methods of evaporation with a shadow mask or screen printing.

In step 6, optionally, the output coupler and/or a scattering layer 145 can be applied to organic light emitting devices 200 individually, or more typically can be applied across a number of organic light emitting devices 200, as shown in FIG. 12. Although not shown in step 6, a nonconductive material such as SPIE (siloxane polyimide epoxy) can be inserted into the gaps 175 between adjacent organic light emitting devices 200. Although only two organic light emitting devices 200 are shown in FIG. 12, this method can of course be used to make large area light sources comprising many individual organic light emitting devices 200.

Although embodiments of the present invention allow the organic light emitting devices 200 to be placed very close to each other on the mounting substrate 160, it may be desirable in some applications to have a larger spacing between individual organic light emitting devices 200. In such cases, it may not be desirable to have a scattering layer which bridges adjacent organic light emitting devices 200.

Spacing between organic light emitting devices 200 may also occur in the case where the mounting substrate 160 is designed to be flexible, curved, or non-planar. The mounting substrate 160 may be formed in any desired shape, e.g. to conform to an existing building structure. The organic light emitting devices 200 can be sized such that they collectively follow the shape of the mounting substrate. Thus, the combination of a flexible, curved, or non-planar mounting substrate and appropriately sized organic light emitting devices 200 can produce a light source having an emitting surface in many desired shapes, e.g. cylindrical, spherical, etc. The spacing of the organic light emitting devices 200 on the mounting substrate 160 can also be designed such that the mounting substrate 160 can form a right angle between adjacent organic light emitting devices 200. In this case, the emitting surfaces of adjacent organic light emitting devices would together form a corner with perpendicular emitting surfaces.

Figure 13:
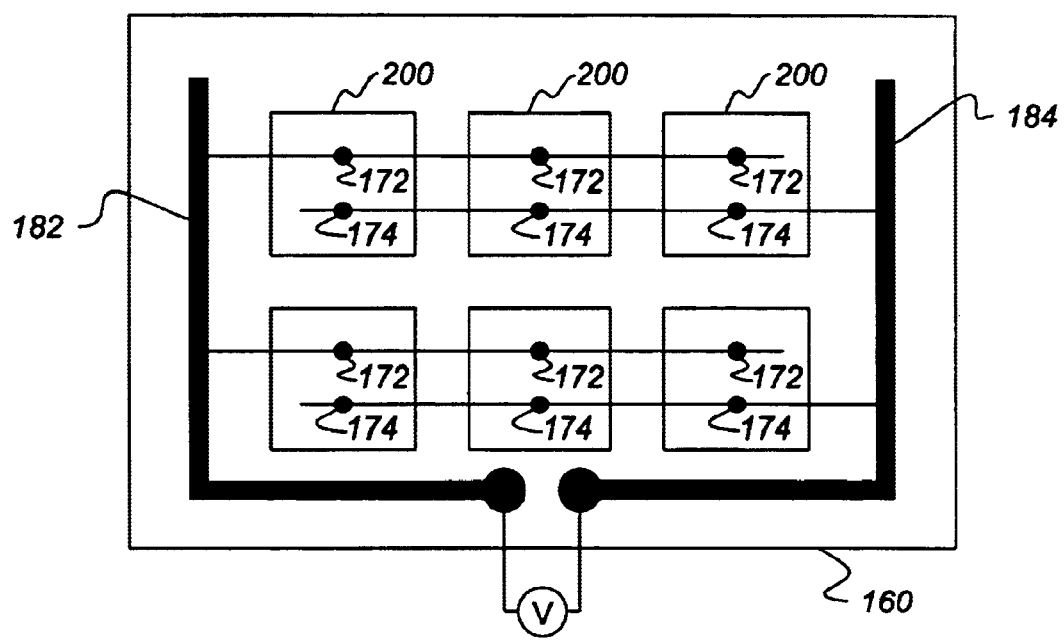
FIG. 13 is a diagram of electrical connections to a plurality of organic light emitting devices according to a preferred embodiment of the invention.

After the mounting electrical contacts have been installed, they can be connected to a suitable power supply. FIG. 13 illustrates an example of a connection layout for six organic light emitting devices 200. The first mounting electrical contacts 172 are all connected to a first line 182 and the second mounting electrical contacts 174 are all connected to a second line 184. Upon application of a voltage, the plurality of organic light emitting devices 200 are activated. One advantage of exemplary embodiments of the invention is that the connecting structure, e.g. as shown in FIG. 13, can utilize highly conductive materials such as copper to efficiently carry power to the individual organic light emitting devices 200.

Preferably, the fill factor of the devices 200 in FIGS. 12 and 13 is above 0.3, most preferably between 0.5 and 0.8. The fill factor is defined as a ratio of the area of the devices 200 to the total area of the mounting substrate 160. The high fill factor is advantageous for a device used for lighting applications.

IV. Emission Optimization

In one preferred embodiment of the present invention, the cathode reflectivity, the output coupler's shape, composition and optical thickness are optimized to increase the extraction efficiency of the OLED 100, 200. The cathode 120 material of the devices 100, 200 illustrated in FIGS. 4 and 9, respectively, is selected to have a reflectivity of 80% and above, preferably 86% and above. Examples of such cathode 120 materials include calcium, which has a reflectivity of 80% in the visible region of 400–700 nm, aluminum, which has a reflectivity of greater than 86% throughout the visible region and silver, which has a reflectivity of 90% in the visible region. Gold also a reflectivity above 95% at wavelengths longer than 680 nm.

The output coupler 3, 145 shape contains the outer surface with dimples or corrugations, as illustrated in FIGS. 1 and 2. The output coupler 3, 145 composition contains light scattering particles 9 in a matrix material 8. The output coupler 3, 145 optical thickness for scattering is selected to range from about 0.1 to about 0.9, preferably about 0.5. Optical thickness for scattering is defined in P. S. Mudgett et al., 10 Appl. Optics (July 1971) 1485, incorporated herein by reference, and is a function of the product of the output coupler thickness, the concentration of the light scattering particles and the light scattering efficiency of the particles. Therefore, the thickness of the output coupler as well as the type and concentration of the light scattering particles 9 may be varied in this embodiment as desired, as long as the optical thickness for scattering of the output coupler is selected to range from about 0.1 to about 0.9, preferably about 0.5.

A corresponding value of the degree of light scattering can be gleaned from experimental data rather than from theoretical calculations of the optical thickness for scattering, such as that of Mudgett et al. Experimentally, a degree of light scattering can be quantified by determining what fraction of a nearly collimated beam of light incident on the plate at normal incidence is transmitted through the plate and remains collimated after transmission, as opposed to being reflected or scattered into other, non-normal angles following transmission. Thus, for isotropically scattering particles embedded in a medium having an index of refraction of 1.5 and having an optical thickness for scattering value of 0.1, the degree of light scattering is 0.835. For isotropically scattering particles embedded in a medium having an index of refraction of 1.5 and having an optical thickness for scattering value of 0.9, the degree of light scattering 0.38.

Figure 14:
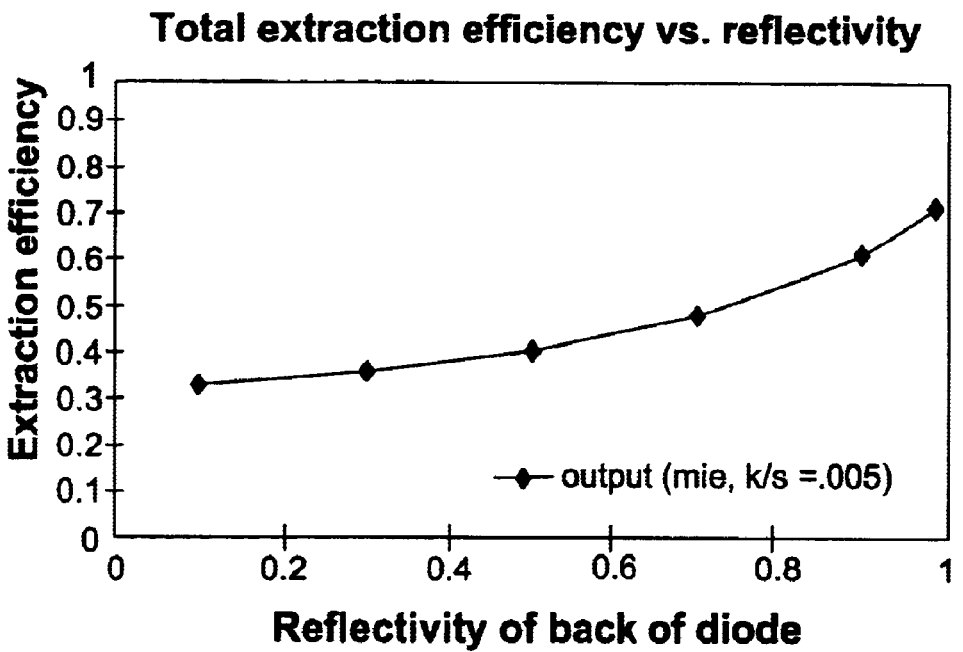
FIG. 14 is a graph of the calculated extraction efficiency versus cathode reflectivity for an organic light emitting device according to a preferred embodiment of the invention.

FIG. 14 is a graph of a calculated total extraction efficiency versus reflectivity of the of the back of the OLED. Extraction efficiency is defined as a ratio of the number of light photons emitted into the air divided by the number of light photons produced in the organic light emitting layer 110. The extraction efficiency was calculated (using scheme of Mudgett et.al.) based upon the Mie model of light scattering for particles embedded in a media having a 1.45 index of refraction. The Mie model assumes spherical particles which are approximately one optical wavelength in size. In the graph of FIG. 14, the reflectivity of the back of the OILED device 100, 200 was selected to be the reflectivity of the cathode 120. It was assumed that the glass matrix 8 and light scattering particles 9 comprised a GE214HDO glass available from GE Quartz which contains a 214 quartz glass matrix having an index of refraction of about 1.47 and hafnia particles that scatter light, as disclosed in U.S. Pat. No. 5,900,381, incorporated herein by reference. The efficiency of injection from the active layer into the glass was assumed to be 0.77, the ratio of medium (k/s) absorption to scattering was assumed to be 0.005 and the optical thickness for scattering value, "s", of the output coupler was assumed to be 0.5. As can be seen from FIG. 14, the light extraction efficiency ranges from about 0.55 for cathode reflectivity of 80% to about 0.73 for cathode reflectivity of 98%. Therefore, an extraction efficiency of about 55% may be obtained by using a calcium cathode, of about 58% by using an aluminum electrode and of about 73% by using a silver electrode. This is an improvement of about 20 to 40% in the value of extraction efficiency compared to an OLED that lacks an output coupler.

Figure 15:
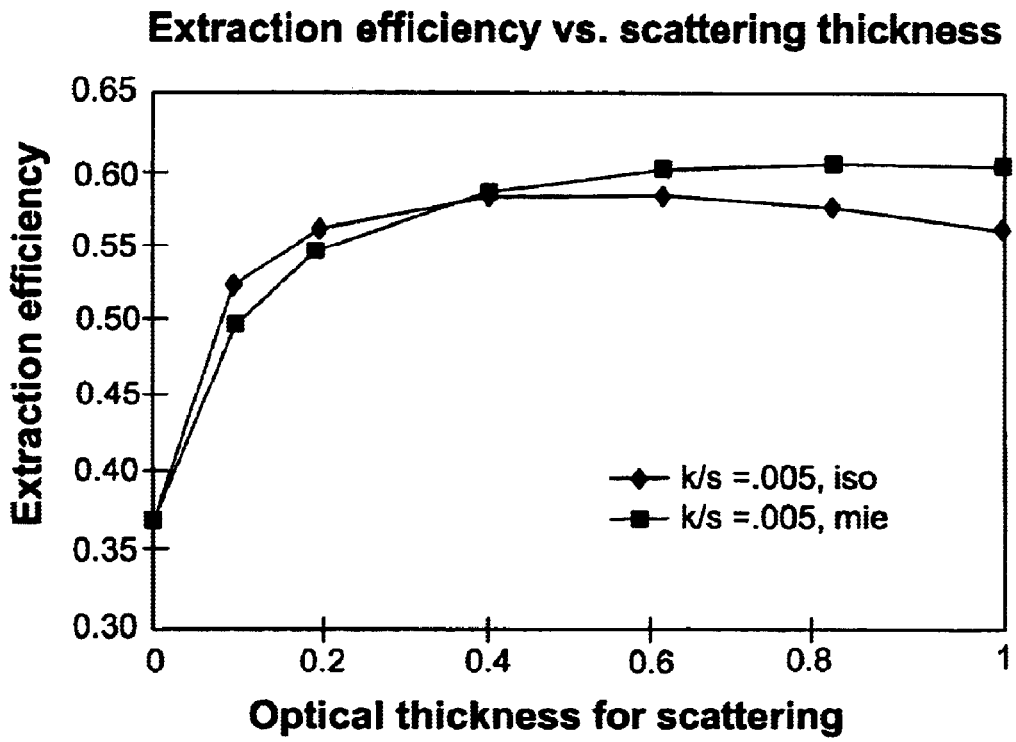
FIG. 15 is a graph of the calculated extraction efficiency versus optical thickness for an organic light emitting device according to a preferred embodiment of the invention.

FIG. 15 is a graph of a calculated total extraction efficiency versus optical thickness. The extraction efficiency was calculated (using scheme of Mudgett et.al.) based upon the Mie (square markers in FIG. 15) and isotropic (rhombus markers) models of light scattering for particles embedded in a media having a 1.45 index of refraction. The isotropic model assumes each particle scatters light uniformly in all directions. In the graph of FIG. 15, the reflectivity of the back of the OLED device 100, 200 was selected to be the reflectivity of the cathode 120, which has a selected reflectivity value of 87%. The other conditions were the same as in FIG. 14. As can be seen from FIG. 15, the extraction efficiency ranges from about 0.5 to 0.52 for an optical thickness value of 0.1 to about 0.56 to about 0.6 for an optical thickness value of 0.9. The extraction efficiency is 0.55 and above for an optical thickness value of 0.2 and above.

Figure 16:
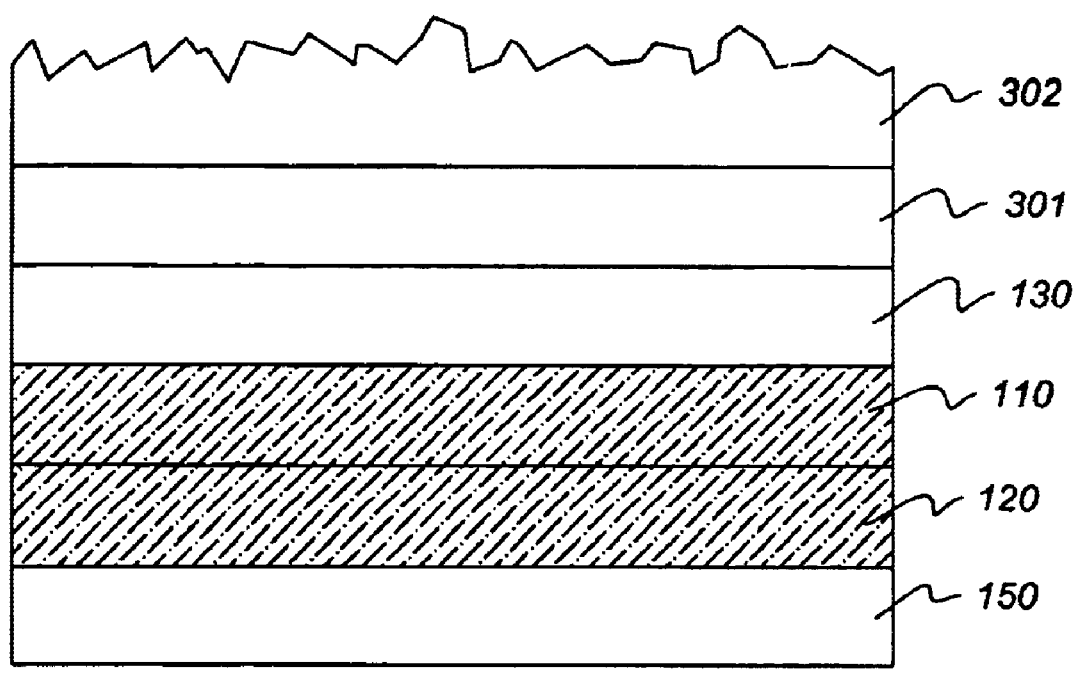
FIG. 16 is a drawing of an organic light emitting device according to one preferred embodiment of the invention.

In another preferred embodiment of the present invention, the extraction efficiency may be further improved by using a plurality of output coupler layers instead of a single output coupler layer 3 in FIGS. 1–3. For example, by using a higher index of refraction output coupler layer 301 and a lower index of refraction output coupler layer 302, the extraction efficiency may be increased by 2–3%. FIG. 16 illustrates a preferred aspect of this embodiment. A first output coupler layer 301 is formed on the transparent ITO anode layer 130. A second output coupler layer 302 having a lower index of refraction than layer 301 is formed on layer 301. For example, layer 301 may comprise SF1 glass having n=1.72 and layer 302 may comprise SF2 glass having n=1.65. Using this layout, the first output coupler layer 301 has an index of refraction that is close to the index of refraction value of about 1.9 of the ITO anode layer 130. Thus, the index of refraction of layer 301 is matched to that of the underlying active device layer 130 (i.e, to a surface of the OLED device). Furthermore, the index of refraction of layer 302 is matched to that of layer 301. Therefore, the critical angle and Fresnel losses at the interfaces of layers 130/301 and 301/302 are reduced. Furthermore, since the difference between the index of refraction of air (n=1) and layer 302 is less than the difference between the index of refraction of air and layer 301, the losses at the air/output coupler interface are reduced by adding layer 302.

It should be noted that layer 302 preferably has a corrugated outer surface, as illustrated in FIG. 16. Layers 301 and/or 302 may also contain nanoparticles and/or light scattering particles or voids 9, as described with respect to FIGS. 1–3. Furthermore, layers 301 and/or 302 may comprise other glass and/or polymer materials, as desired. Still further, third through nth output coupler layers may be added over layer 302, with each succeeding layer having a smaller index of refraction in order to further reduce the large difference in the index of refraction between air and the outer output coupler layer.

Alternatively, an output coupler 3 with a graded or gradually decreasing index of refraction from its inner to its outer surface may be used instead. Such an output coupler may be obtained by graded or gradient doping the output coupler layer with the nanoparticles. For example, the inner portion of layer 3 (i.e., the portion adjacent to the active device layers) may have the highest nanoparticle doping concentration and the outer portion (i.e., the portion adjacent to the air interface) may have the lowest nanoparticle doping concentration. Thus, an inner portion of the layer has a first index of refraction that is matched to an index of refraction of an adjacent layer of the electroluminescent device and an outer portion of the layer has a second index of refraction that is lower than the first index of refraction. The gradient or graded index of refraction profile reduces losses at the interface between discrete layers 301 and 302.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. An organic electroluminescent light emitting device, comprising:
   an assemblage capable of emitting light and an output coupler disposed adjacent to an element of said assemblage; wherein said assemblage comprising:
   a first electrode;
   a second electrode; and
   at least one organic light emitting layer; and
   wherein said output coupler reduces a Fresnel loss and has an index of refraction that matches an index of refraction of an element of said assemblage adjacent said output coupler.

2. An organic electroluminescent light emitting device comprising an assemblage and an output coupler; the assemblage comprising a first electrode, a second electrode, and at least one organic light emitting comprising a first electrode, a second electrode, and at least one organic light emitting layer; wherein the assemblage comprises an organic light emitting diode; the output coupler reduces both a critical angle loss and a Fresnel loss; an index of refraction of the output coupler is matched to an index of refraction of an adjacent layer of the assemblage.

3. The device according to claim 2, wherein the index of refraction of the output coupler is the same as or close to the index of refraction of an adjacent layer of the organic light emitting diode.

4. The device according to claim 3, wherein the index of refraction of the output coupler is the same as the index of refraction of an adjacent layer of the organic light emitting diode.

5. The device of claim 2, further comprising a transparent substrate between the output coupler and the at least one organic light emitting layer, wherein the index of retraction of the output coupler is matched to an index of refraction of the substrate.

6. The device of claim 5, wherein the index of refraction of the output coupler is the same as or close to the index of refraction of the substrate.

7. The device of claim 6, wherein the index of refraction of the output coupler is the same as the index of refraction of the substrate.

8. The device of claim 2, wherein the output coupler comprises a matrix material containing light scattering particles.

9. The device of claim 8, wherein:

the matrix material comprises a glass or polymer material; and the light scattering particles comprise 0.1 to 20 micron light scattering particles.

10. The device of claim 8, wherein the matrix material comprises silicone or epoxy containing:

titania or zinc oxide light scattering particles; and nanoparticles having a size of less than 100 nm which adjust an index of refraction of the matrix material such that it is equal or close to the index of refraction of the substrate.

11. The device of claim 2, wherein the output coupler comprises a shaped transparent material attached to the organic light emitting diode.

12. The device of claim 11, wherein the shaped transparent material comprises glass or polymer material having a corrugated or dimpled light emitting surface attached to a transparent substrate of the organic light emitting diode.

13. The device of claim 12, wherein each dimple has a height greater than 0.1 microns and a spacing between dimple peaks is a factor of 10 or less of the dimple height.

14. The device of claim 13, wherein the shaped transparent material comprises nanoparticles having a size of less than 100 nm which adjust an index of refraction of the shaped transparent material such that it is equal or close to the index of refraction of the substrate.

15. The device of claim 2, wherein the output coupler comprises a transparent substrate having corrugated or dimpled light emitting surface.

16. The device of claim 15, wherein each dimple has a height of greater than 0.1 microns and a spacing between dimple peaks is a factor of 10 or less of the dimple height.

17. The device of claim 16, wherein the substrate comprises a glass or a polymer substrate containing nanoparticles having a size of less than 100 nm which adjust an index of refraction of the substrate such that it is equal or close to the index of refraction of the device.

18. An organic electroluminescent light emitting device comprising:

a first electrode;

a second electrode;

at least one organic light emitting layer; and an output coupler which reduces a Fresnel loss;

wherein:

the electroluminescent device emits white light;

the first electrode comprises a metal containing electrode;

the organic light emitting layer comprises at least one organic molecule layer or at least one polymer layer over a first side of the first electrode;

the second electrode comprises a transparent electrode having a first side over the organic light emitting layer; and the electroluminescent device further comprising:
a voltage source; and
a luminescent material.

19. The device of claim 18, wherein the luminescent material comprises a phosphor layer between a device substrate and the output coupler.

20. The device of claim 18, wherein the luminescent material comprises a phosphor incorporated into the output coupler.

21. The device of claim 18, further comprising:

a first device electrical contact contacting the first side of the first electrode;

a second device electrical contact contacting a second side of the second electrode;

a sealing member over the second side of the second electrode;

a mounting substrate over the sealing member; and a plurality of organic electroluminescent devices below the mounting substrate having a fill factor of greater than 0.3.

22. An organic electroluminescent light emitting device comprising:

a first electrode;

a second electrode;

at least one organic light emitting layer; and an output coupler which reduces a Fresnel loss;

wherein:

a reflectivity of a non-light emitting side of the device is 80% or higher;

the output coupler optical thickness for scattering is about 0.1 to about 0.9; and the device emission extraction is 55% or higher.

23. The device of claim 22, wherein:

a reflectivity of a non-light emitting side of the device is 86% or higher;

the output coupler optical thickness for scattering is about 0.5; and the device emission extraction is 58% or higher.

24. An organic electroluminescent light emitting device comprising an assemblage capable of emitting light and an output coupler that reduces a Fresnel loss; wherein the assemblage comprises:

a first electrode;

a second electrode; and at least one organic light emitting layer; and wherein the output coupler comprises:

a first layer having a first index of refraction that is matched to an index of refraction of an adjacent layer of the assemblage; and a second layer having a second index of refraction lower that the first index of refraction.

25. An organic electroluminescent light emitting device comprising an assemblage capable of emitting light and an output coupler that reduces a Fresnel loss; wherein the assemblage comprises:

a first electrode;

a second electrode; and at least one organic light emitting layer; and wherein the output coupler a layer having a graded index of refraction, wherein an inner portion of the layer has a first index of refraction that is matched to an index of refraction of an adjacent layer of the assemblage, and an outer portion of the layer has a second index of refraction that is lower that the first index of refraction.

26. An organic electroluminescent light emitting device, comprising:

a first electrode;

at least one organic light emitting layer over the first electrode;

a second transparent electrode over the at least one organic light emitting layer; and a shaped transparent material which has corrugated or dimpled light emitting surface and which contains nanoparticles having a size of less than 100 nm over the second transparent electrode.

27. The device of claim 26, wherein:

the organic electroluminescent light emitting device, comprises an organic light emitting diode;

the first electrode comprises a metal containing electrode;

the organic light emitting layer comprises at least one organic molecule layer or at least one polymer layer;

the second electrode comprises an indium tin oxide electrode;

the shaped transparent material comprises a glass or a polymer material containing 0.1 to 20 micron light scattering particles; and each dimple has a height of greater than 0.1 microns and a spacing between dimple peaks is a factor of 10 or less of the dimple height.

28. The device of claim 26, wherein the shaped transparent material comprises a glass or polymer material formed on a glass or polymer substrate.

29. The device of claim 26, wherein the shaped transparent material comprises a glass or polymer material substrate onto which the organic electroluminescent light emitting device is fabricated.

30. An organic electroluminescent device, comprising:

a first electrode;

at least one organic light emitting layer over the first electrode;

a second transparent electrode over the at least one organic light emitting layer; and a matrix material containing light scattering particles over the second electrode, the light scattering particles having a size in arrange from about 0.1 to about 20 microns.

31. The device of claim 30, wherein:

the matrix material comprises silicone or epoxy formed over a glass or polymer substrate; and the light scattering particles comprise 0.1 to 20 micron titania or zinc oxide light scattering particles.

32. The device of claim 31, wherein the matrix material further comprises nanoparticles having a size of less than 100 nm.

33. An organic electroluminescent light emitting device, comprising:

a first electrode;

at least one organic light emitting layer over the first electrode;

a second transparent electrode over the at least one organic light emitting layer; and a shaped transparent material whose index of refraction is selected to match that of an adjacent layer of the light emitting device.

34. The device of claim 33, wherein the shaped transparent material contains nanoparticles having a size of less than 100 nm and a corrugated or dimpled light emitting surface.

* * * * *